(12) United States Patent
Jung et al.

(10) Patent No.: US 12,245,491 B2
(45) Date of Patent: Mar. 4, 2025

(54) DISPLAY PANEL AND A DISPLAY APPARATUS INCLUDING THE SAME

(71) Applicant: Samsung Display Co., Ltd., Yongin-si (KR)

(72) Inventors: Sukyo Jung, Yongin-si (KR); Daesuk Kim, Yongin-si (KR); Ilgoo Youn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/233,248

(22) Filed: Aug. 11, 2023

(65) Prior Publication Data

US 2024/0164195 A1 May 16, 2024

(30) Foreign Application Priority Data

Nov. 16, 2022 (KR) .................. 10-2022-0153811

(51) Int. Cl.
*G09G 3/3233* (2016.01)
*H10K 59/131* (2023.01)
*H10K 59/88* (2023.01)

(52) U.S. Cl.
CPC .......... *H10K 59/88* (2023.02); *G09G 3/3233* (2013.01); *H10K 59/131* (2023.02); *G09G 2300/0413* (2013.01); *G09G 2300/0426* (2013.01); *G09G 2300/0819* (2013.01); *G09G 2300/0842* (2013.01)

(58) Field of Classification Search
CPC ............... G09G 2310/0267; G09G 2310/0286
See application file for complete search history.

(56) References Cited

U.S. PATENT DOCUMENTS

| 9,978,314 | B2 | 5/2018 | Bae et al. | |
| 10,475,389 | B2 | 11/2019 | Kim et al. | |
| 11,355,071 | B2 | 6/2022 | Kim et al. | |
| 2017/0116923 | A1* | 4/2017 | Bae | G11C 19/28 |
| 2019/0293998 | A1* | 9/2019 | Hasegawa | G02F 1/1333 |
| 2020/0083301 | A1* | 3/2020 | Bok | H10K 50/844 |
| 2021/0126078 | A1* | 4/2021 | Lee | H10K 59/60 |
| 2021/0378107 | A1 | 12/2021 | Hwang et al. | |

(Continued)

FOREIGN PATENT DOCUMENTS

| KR | 10-2018-0030314 A | 3/2018 |
| KR | 10-2021-0127283 A | 10/2021 |

(Continued)

*Primary Examiner* — Yuzhen Shen
(74) *Attorney, Agent, or Firm* — Womble Bond Dickinson (US) LLP

(57) ABSTRACT

A display panel includes: a substrate comprising a display area and a corner area, the corner area located outside the display area and having curved sides or polygonal sides; a plurality of pixels in the display area in a first direction and a second direction intersecting the first direction; a driving portion in the corner area and comprising a plurality of normal stages and a plurality of dummy stages between the plurality of normal stages, the plurality of normal stages being configured to output electrical signals to the plurality of pixels; and an alignment mark in the corner area, wherein the corner area includes a notch area that is defined based on the alignment mark, and some of the plurality of dummy stages are in the notch area.

21 Claims, 11 Drawing Sheets

NSTG : NSTG1, NSTG2, NSTG3
NSTG4, NSTG5, NSTG6
DSTG : DSTG1, DSTG2

(56) References Cited

U.S. PATENT DOCUMENTS

2022/0045140 A1* 2/2022 Bai .................. H10K 59/131
2022/0165217 A1   5/2022 Lee et al.

FOREIGN PATENT DOCUMENTS

| KR | 10-2021-0148550 A | 12/2021 |
| KR | 10-2022-0072003 A | 6/2022 |
| KR | 10-2429674 B1 | 8/2022 |

* cited by examiner

DISPLAY PANEL AND A DISPLAY APPARATUS INCLUDING THE SAME

CROSS-REFERENCE TO RELATED APPLICATION

The present application claims priority to and the benefit of Korean Patent Application No. 10-2022-0153811, filed on Nov. 16, 2022, in the Korean Intellectual Property Office, the entire disclosure of which is incorporated herein by reference.

BACKGROUND

1. Field

Aspects of one or more embodiments relate to a display panel and a display apparatus including the same.

2. Description of the Related Art

Generally, a display apparatus may include a window, a display panel, a cover panel, a printed circuit board, and the like. The display panel may include a display element and a driving circuit to control the emission of light from display elements, a degree of emission, and the like. The driving circuit may include a thin film transistor and a plurality of wirings.

When the display panel, the window, the cover panel, the printed circuit board, and the like are assembled together, any two thereof to be assembled may be aligned with respect to an alignment mark formed on each member.

The above information disclosed in this Background section is only for enhancement of understanding of the background and therefore the information discussed in this Background section does not necessarily constitute prior art.

SUMMARY

Aspects of one or more embodiments relate to a display panel and a display apparatus including the same, and for example, to a display panel capable of displaying relatively high-quality image and a display apparatus including the same.

A display apparatus according to the related art may have a problem in that, as a dead space is reduced, the notch of a cover panel may overlap a portion of a driving circuit.

Aspects of one or more embodiments include a display apparatus capable of displaying relatively high-quality images. However, such characteristics are merely examples, and the scope of embodiments according to the present disclosure is not limited thereby.

Additional aspects will be set forth in part in the description which follows and, in part, will be more apparent from the description, or may be learned by practice of the presented embodiments of the disclosure.

According to one or more embodiments, a display panel includes a substrate including a display area and a corner area, the corner area located outside the display area and having curved sides or polygonal sides, a plurality of pixels arranged in the display area in a first direction and a second direction intersecting the first direction, a driving portion arranged in the corner area and comprising a plurality of normal stages and a plurality of dummy stages arranged between the plurality of normal stages, the plurality of normal stages outputting electrical signals to the plurality of pixels, and an alignment mark arranged in the corner area, wherein the corner area includes a notch area that is defined based on the alignment mark, and some of the plurality of dummy stages are arranged in the notch area.

According to some embodiments, the plurality of normal stages and the plurality of dummy stages may be arranged along a virtual line corresponding to the curved sides or polygonal sides, and the number of dummy stages arranged for each unit length may be determined based on an angle between the virtual line and the first direction.

According to some embodiments, each of the plurality of normal stages and the plurality of dummy stages may include an input terminal, an output terminal, a first power terminal, and a second power terminal, a first gate voltage may be applied to the first power terminal of each of the plurality of normal stages and the plurality of dummy stages, and a second gate voltage may be applied to the second power terminal of each of the plurality of normal stages and the plurality of dummy stages.

According to some embodiments, an external start signal or a carry signal output by a neighboring preceding normal stage may be applied to the input terminal of each of the plurality of normal stages, and the first gate voltage may be applied to the input terminal of each of the plurality of dummy stages.

According to some embodiments, the output terminal of each of the plurality of dummy stages may be floating.

According to some embodiments, the alignment mark may include a first alignment mark and a second alignment mark, the first alignment mark and the second alignment mark being symmetrical with respect to a first virtual center line passing through a center of the display area and extending in the second direction, and the notch area may include a first notch area defined with respect to the first alignment mark and a second notch area defined with respect to the second alignment mark.

According to some embodiments, the alignment mark may further include a third alignment mark and a fourth alignment mark, the third alignment mark and the fourth alignment mark being symmetrical with respect to a second virtual center line passing through the first and second alignment marks and the center of the display area, and extending in the first direction, and the notch area may include a third notch area defined with respect to the third alignment mark and a fourth notch area defined with respect to the fourth alignment mark.

According to some embodiments, the plurality of normal stages may not overlap the notch area.

According to some embodiments, the driving portion may include a first driving portion and a second driving portion spaced apart from the first driving portion, the structure of a normal stage arranged in the first driving portion may be identical to the structure of a dummy stage arranged in the first driving portion, and the structure of a normal stage arranged in the second driving portion may be identical to the structure of a dummy stage arranged in the second driving portion.

According to some embodiments, the first driving portion may include an emission control circuit and a first scan driving circuit, and the second driving portion may include a second scan driving circuit.

According to one or more embodiments, a display apparatus includes a display panel, a cover panel on a rear surface of the display panel, and including an alignment notch, wherein the display panel may include a substrate including a display area and a corner area, the corner area located outside the display area and having curved sides or polygonal sides, a plurality of pixels arranged in the display area in a first direction and a second direction intersecting the first direction, a driving portion arranged in the corner area and including a plurality of normal stages and a plurality of dummy stages arranged between the plurality of normal stages, the plurality of normal stages outputting electrical signals to the plurality of pixels, and an alignment mark arranged in the corner area, wherein the alignment notch of the cover panel overlaps some of the plurality of dummy stages of the display panel in the thickness direction thereof.

According to some embodiments, the plurality of normal stages and the plurality of dummy stages may be arranged along a virtual line corresponding to the curved sides or the polygonal sides, and the number of dummy stages arranged for each unit length may be determined based on an angle between the virtual line and the first direction.

According to some embodiments, each of the plurality of normal stages and the plurality of dummy stages may include an input terminal, an output terminal, a first power terminal, and a second power terminal, a first gate voltage may be applied to the first power terminal of each of the plurality of normal stages and the plurality of dummy stages, and a second gate voltage may be applied to the second power terminal of each of the plurality of normal stages and the plurality of dummy stages.

According to some embodiments, an external start signal or an output signal of a neighboring preceding normal stage may be applied to the input terminal of each of the plurality of normal stages, and the first gate voltage may be applied to the input terminal of each of the plurality of dummy stages.

According to some embodiments, the output terminal of each of the plurality of dummy stages may be floating.

According to some embodiments, the driving portion may include a first driving portion and a second driving portion spaced apart from the first driving portion, the structure of a normal stage arranged in the first driving portion may be identical to the structure of a dummy stage arranged in the first driving portion, and the structure of a normal stage arranged in the second driving portion may be identical to the structure of a dummy stage arranged in the second driving portion.

According to some embodiments, the first driving portion may include an emission control circuit and a first scan driving circuit, and the second driving portion may include a second scan driving circuit, display apparatus.

According to some embodiments, the alignment mark may include a first alignment mark and a second alignment mark, the first alignment mark and the second alignment mark being symmetrical with respect to a first virtual center line passing through a center of the display area and extending in the second direction, and the alignment notch may include a first alignment notch corresponding to the first alignment mark and a second alignment notch corresponding to the second alignment mark.

According to some embodiments, the alignment mark may further include a third alignment mark and a fourth alignment mark, the third alignment mark and the fourth alignment mark being symmetrical with respect to a second virtual center line passing through the first and second alignment marks and the center of the display area, and extending in the first direction, and the alignment notch may include a third alignment notch corresponding to the third alignment mark and a fourth alignment notch corresponding to the fourth alignment mark.

According to some embodiments, the plurality of normal stages may not overlap the alignment notch.

According to some embodiments, the cover panel may be smaller than the display panel, and an edge of the cover panel may be located outside the driving portion.

Other aspects, features, and characteristics than those described above will become more apparent from the following drawings, claims, and detailed description of the disclosure

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
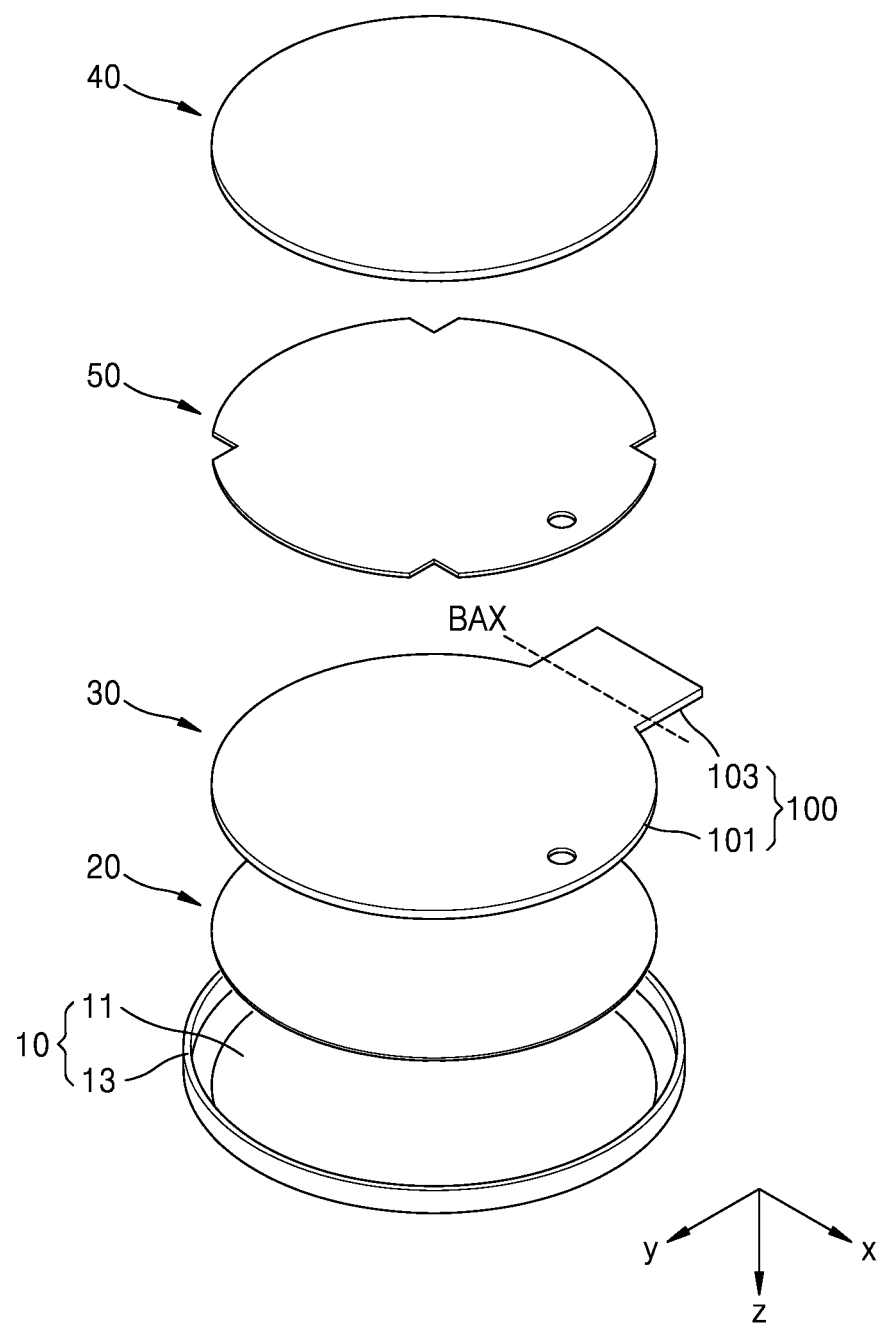
FIG. 1 is a schematic exploded perspective view of a portion of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, aspects of some embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

Hereinafter, aspects of some embodiments will be described in more detail with reference to the accompanying drawings, and in the description with reference to the drawings, the same or corresponding constituents are indicated by the same reference numerals and redundant descriptions thereof are omitted.

In the specification, it will be understood that although the terms "first," "second," etc. may be used herein to describe various components, these components should not be limited by these terms.

In the specification, the expression of singularity in the specification includes the expression of plurality unless clearly specified otherwise in context.

In the specification, when a part may "include" or "have" a certain constituent element, unless specified otherwise, it may not be construed to exclude another constituent element but may be construed to further include other constituent elements.

In the specification, it will be understood that when a layer, region, or component is referred to as being "formed on" another layer, region, or component, it can be directly or indirectly formed on the other layer, region, or component. That is, for example, intervening layers, regions, or components may be present.

In the specification, it will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

In the specification, the expression such as "A and/or B" may include A, B, or A and B. Furthermore, the expression such as "at least one of A and B" may include A, B, or A and B.

In the specification, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the specification, when a certain embodiment may be implemented differently, a specific process order may be performed differently from the described order. For example, two consecutively described processes may be performed substantially at the same time or performed in an order opposite to the described order.

Sizes of components in the drawings may be exaggerated for convenience of explanation. For example, because sizes and thicknesses of components in the drawings are arbitrarily illustrated for convenience of explanation, the following embodiments are not limited thereto.

FIG. 1 is a schematic exploded perspective view of a portion of a display apparatus according to some embodiments.

The display apparatus according to some embodiments may include a window 10, a display panel 30, a cover panel 50, and a printed circuit board 40. As illustrated in FIG. 1, the display apparatus may further include various constituent elements as necessary or desired. For example, the display apparatus may further include a light-transmissive adhesive layer 20 located between the window 10 and the display panel 30 and bonding or mechanically connecting the window 10 to the display panel 30.

The window 10 may be formed of a light-transmissive material, and the window 10 may include, for example, glass or polymer resin. The window 10 may include polymer resin, for example, polyethersulfone, polyacrylate, polyetherimide, polyethylene naphthalate, polyethylene terephthalate, polyphenylene sulfide, polyarylate, polyimide, polycarbonate, or cellulose acetate propionate.

The window 10 may include a base 11 and an edge portion 13. The base 11 forms the overall appearance of the window 10, and exhibits or enables light transmittance. The edge portion 13 may have a shape protruding from a first virtual plane where the base 11 is located. In FIG. 1, when a direction of a front surface of the display panel 30 where images are displayed is a z direction, the base 11 is arranged on the first virtual plane approximately parallel to an x-y plane, and the edge portion 13 has a shape protruding from the edge of the base 11 in a direction (−z direction) perpendicular to the x-y plane. The base 11 and the edge portion 13 may be integrally formed (e.g., formed as one integrated body) of the same material, but embodiments according to the present disclosure are not limited thereto. For example, the edge portion 13, as a separate component from the base 11, may be coupled to the edge of the base 11. In this case, the edge portion 13 may be non-transmissive unlike the base 11 that is light-transmissive.

The base 11 is arranged on a first virtual plane, but the first plane may be a curved surface. For example, when an electronic apparatus is a smart watch, the base 11 in the window 10 has an overall flat shape, but a surface of the base 11 in a direction (+z direction) opposite to the display panel 30 may include a curved portion.

The display panel 30 may be located on the base 11 of the window 10. The display panel 30 may include, on a substrate, a circuit including an electronic element such as a thin film transistor and the like, and a display element electrically connected to the circuit. The display element may be an organic light-emitting device (or OLED). Embodiments according to the present disclosure are not limited thereto, and the display panel 30 may include various display elements such as a liquid crystal device, not the organic light-emitting device (or OLED).

The display panel 30 may include a substrate 100, and the substrate 100 may be flexible or bendable. For example, the substrate 100 may include a body portion 101 and a bending portion 103. The body portion 101 of the substrate 100 may have a non-rectangular shape having curved sides or polygonal sides. The non-rectangular shape may include, for example, a circle, an oval, a polygon partially having a curved side, or a polygon except a rectangle.

The bending portion 103 of the substrate 100 may extend from the body portion 101 in one direction (−y direction), and may be bent with respect to a bending axis BAX to contact the printed circuit board 40 described below. Accordingly, when the substrate 100 that is bent is viewed from a direction (z direction) perpendicular to the substrate 100, the size of a non-display area perceived (or perceivable) by users may be relatively reduced.

The cover panel 50 may be arranged in a rear surface direction (−z direction) of the display panel 30, and may serve to shield the display panel 30 from external electrical signals, electromagnetic waves, external light, and the like.

According to some embodiments, the cover panel 50 may have a stacked or layered structure including any one or more of a light absorption layer, a buffer member, and a heat dissipation member. The light absorption layer may be provided as a polymer film layer including a light absorption material such as black pigment, dye, and the like. The buffer member may prevent or reduce damage to the display panel 30 by absorbing external shock. According to some embodiments, the buffer member may be provided as a single layer or a stack structure including an elastic material. The heat dissipation member may diffuse heat generated from the display panel 30, the printed circuit board 40, or the like. The heat dissipation member may include a metal plate, a graphite sheet, or the like having relatively excellent heat conductivity.

The printed circuit board 40 may be electrically connected to the display panel 30, as described above. For example, a bending portion 33 of the display panel may be electrically attached on a surface of the printed circuit board 40 in the direction (z direction) toward the window 10. In this case, wirings of the printed circuit board 40 may be electrically connected to pads placed on a surface of the display panel 30 in a direction toward the printed circuit board 40 through anisotropic conductive film, and the like.

The display panel 30, the cover panel 50, and the like may be placed on the window 10. For example, the display panel 30 and the cover panel 50 may be located in a space defined by the base 11 and the edge portion 13 of the window 10. The printed circuit board 40 electrically connected to the display panel 30 may be placed on the cover panel 50.

Figure 2A:
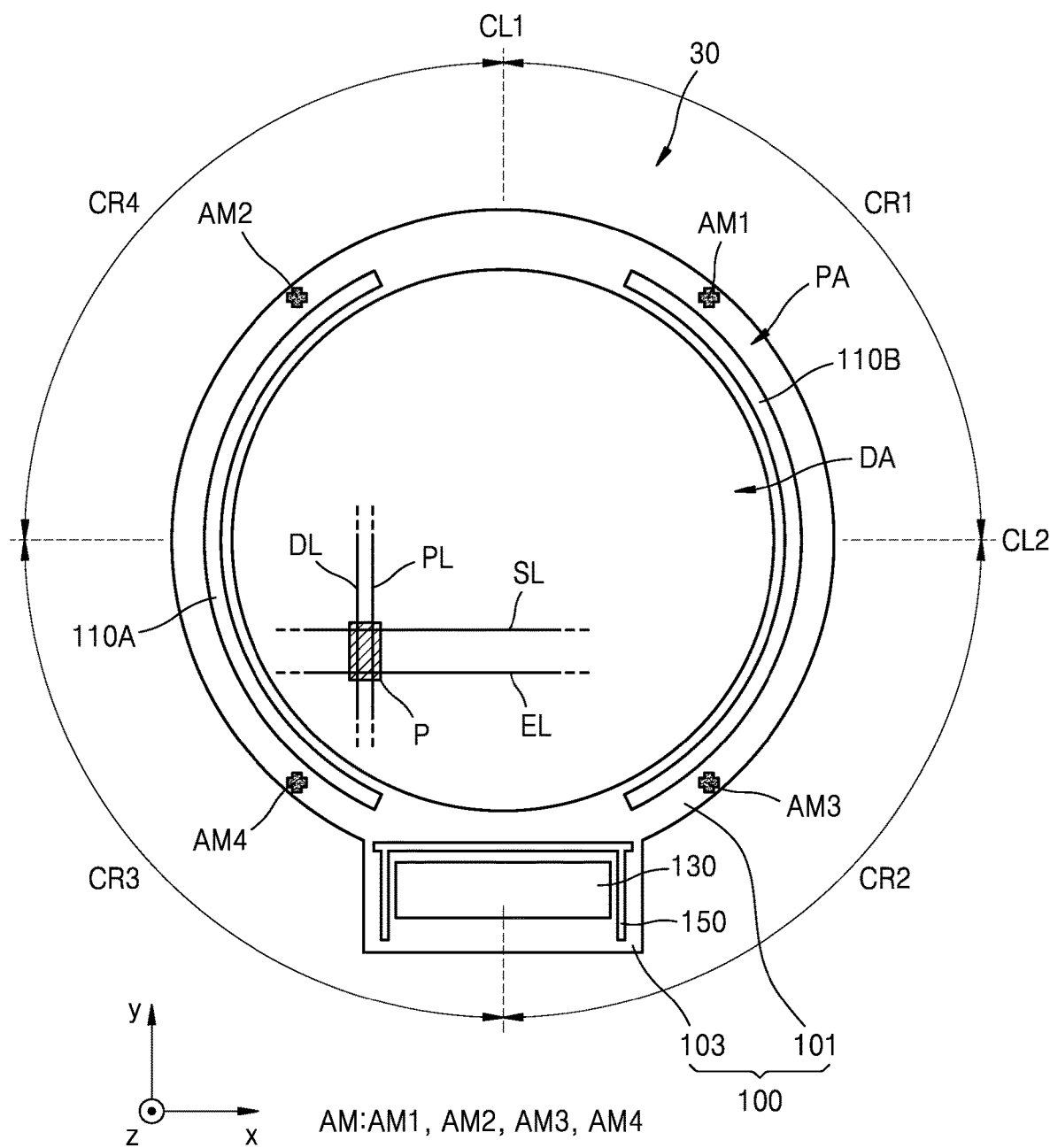
FIG. 2A is a schematic plan view of a display panel in the display apparatus illustrated in FIG. 1.
Figure 2B:
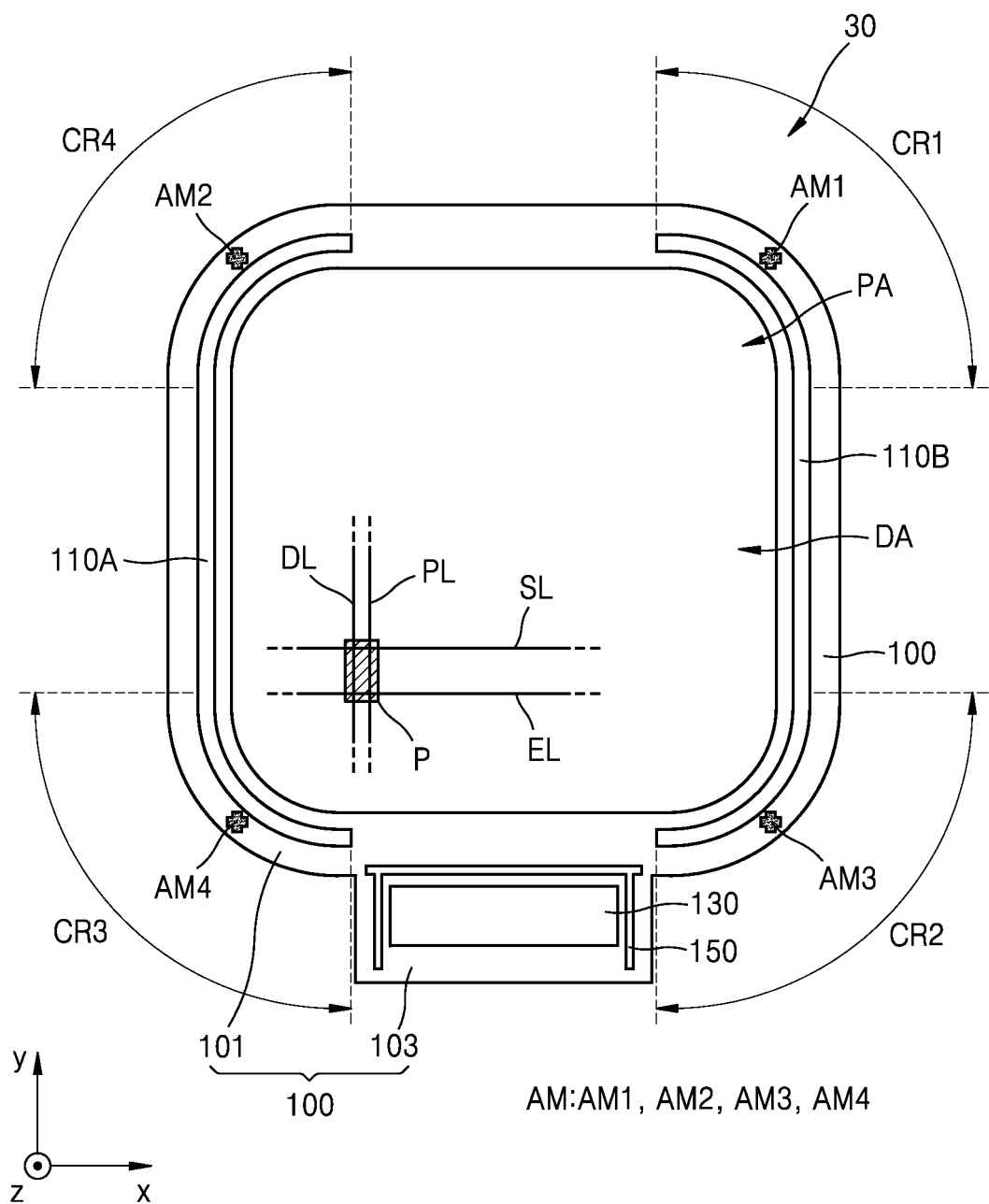
FIG. 2B is a schematic plan view of a display panel according to some embodiments.

FIG. 2A is a schematic plan view of the display panel 30 of the display apparatus illustrated in FIG. 1, and FIG. 2B is a schematic plan view of a display panel according to some embodiments.

Referring to FIGS. 2A and 2B, the display panel 30 may include the substrate 100. The substrate 100 may include a display area DA and a peripheral area PA outside (e.g., in a periphery or outside a footprint of) the display area DA. The display area DA may be arranged in the body portion 101 of the substrate 100. According to some embodiments, as illustrated in FIG. 2A, the body portion 101 and the display area DA of the substrate 100 may have a circular (or relatively circular) shape. According to some embodiments, as illustrated in FIG. 2B, the body portion 101 and the display area DA of the substrate 100 may have a polygonal shape having curved sides, for example, a rectangle shape with rounded corners. Embodiments according to the present disclosure are not limited thereto.

The peripheral area PA may be arranged in the body portion 101 and the bending portion 103 of the substrate 100 to surround the display area DA. In the specification, for convenience of explanation, with reference to FIGS. 2A and 2B, the peripheral area PA corresponding to a curved side in the upper right side, the peripheral area PA corresponding to a curved side in the lower right side, the peripheral area PA corresponding to a curved side in the lower left side, and the peripheral area PA corresponding to a curved side in the upper left side may be referred to as a first corner area CR1, a second corner area CR2, a third corner area CR3, and a fourth corner area CR4, respectively.

According to some embodiments, as shown in FIG. 2A, when the body portion 101 of the substrate 100 has a circular shape, the peripheral area PA may include the first corner area CR1, the second corner area CR2, the third corner area CR3, and the fourth corner area CR4. According to some embodiments, as shown in FIG. 2B, when the body portion 101 of the substrate 100 has a rectangular shape with rounded corners, the peripheral area PA may include a straight area arranged between neighboring ones of the first corner area CR1, the second corner area CR2, the third corner area CR3, and the fourth corner area CR4. Embodiments according to the present disclosure are not limited thereto, and the body portion 101 of the substrate 100 may have various shapes with curved sides or polygonal sides.

The substrate 100 may include glass, metal, or polymer resin. For example, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have various modifications, for example, the substrate 100 may have a multilayer structure including two layers each including the polymer resin as above and a barrier layer located between the two layers and including an inorganic material, for example, a silicon oxide (SiOx), a silicon nitride (SiNx), a silicon oxynitride (SiON), and the like.

Although FIGS. 2A and 2B illustrate that, for convenience, the substrate 100 has a structure that is flat on an x-y plane, embodiments according to the present disclosure are not limited thereto. As described above, a portion of the substrate 100, for example, the bending portion 103, may be bent. For the substrate 100 that is bent, when viewed from the direction (z direction) perpendicular to the display area DA, the size of the peripheral area PA perceived by a user may be relatively reduced.

A plurality of pixels P may be arranged in the display area DA. In the specification, each of the pixels P may mean a sub-pixel, and include a display element such as an organic light-emitting diode. The pixels P may emit, for example, red, green, blue, or white light. The pixels P may be arranged in a first direction (x direction) and a second direction (y direction) intersecting the first direction (x direction).

Each pixel P may be electrically connected to outer circuits arranged in the peripheral area PA. The peripheral area PA is an area where the pixels P are not arranged, and a first driving portion 110A, a second driving portion 110B, a data driving circuit 130, a power supply line 150, and the like may be arranged in the peripheral area PA.

The first driving portion 110A and the second driving portion 110B may be spaced apart from each other. The first driving portion 110A and the second driving portion 110B may transmit the same signal or different signals to each pixel P. For example, the first driving portion 110A and the second driving portion 110B may provide scan signals to the pixels P through a scan line SL. At least one of the first driving portion 110A or the second driving portion 110B may provide an emission control signal to the pixels P through an emission control line EL.

The data driving circuit 130 may receive electrical signals from a printed circuit board 40 (see FIG. 1) and the like, and provide data signals to the pixels P through a data line DL. The data driving circuit 130 may be directly formed on the substrate 100, may be an integrated circuit (IC) chip bonded to the substrate 100 via an electric adhesive, or may be attached to the substrate 100 in the form of a chip-on-film (COF), or may be connected to the substrate 100 using any other suitable bonding mechanism.

The power supply line 150 may be configured to provide power received from the printed circuit board 40 and the like to the pixels P through power voltage lines PL.

The data lines DL arranged in the display area DA may be electrically connected to the data driving circuit 130 arranged in the peripheral area PA, the scan lines SL and the emission control lines EL arranged in the display area DA may be electrically connected to the first driving portion 110A or the second driving portion 110B arranged in the peripheral area PA, and the power voltage lines PL arranged in the display area DA may be electrically connected to the power supply line 150 arranged in the peripheral area PA.

Furthermore, the printed circuit board 40 may be electrically connected to the pads placed in an edge of the bending portion 33 of the display panel 30, and the first driving portion 110A, the second driving portion 110B, the data driving circuit 130, and the power supply line 150 may be electrically connected to the pads.

An alignment mark AM may be arranged in the first corner area CR1 to the fourth corner area CR4. The alignment mark AM may be located outside the first driving portion 110A and the second driving portion 110B.

According to some embodiments, a first alignment mark AM1 may be located in the first corner area CR1, and a second alignment mark AM2 may be located in the fourth corner area CR4, to thus achieve symmetry with respect to a first virtual center line CL1 passing through the center of the display area DA of the substrate 100 and extending in the second direction (y direction). Furthermore, a third alignment mark AM3 may be located in the second corner area CR2 to achieve symmetry with respect to a second virtual center line CL2 passing through the center of the display area DA of the substrate 100 and extending in the first direction (x direction). Likewise, a fourth alignment mark AM4 may be located in the third corner area CR3 to achieve symmetry with the third alignment mark AM3 with respect to the first virtual center line CL1. In some embodiments, the first alignment mark AM1, one or more of the second alignment mark AM2, the third alignment mark AM3, and the fourth alignment mark AM4 may be omitted.

An electrode power line may be arranged in the peripheral area PA of the substrate 100, and electrically connected to a counter electrode in the display area DA to provide electrode power to the counter electrode.

Figure 3:
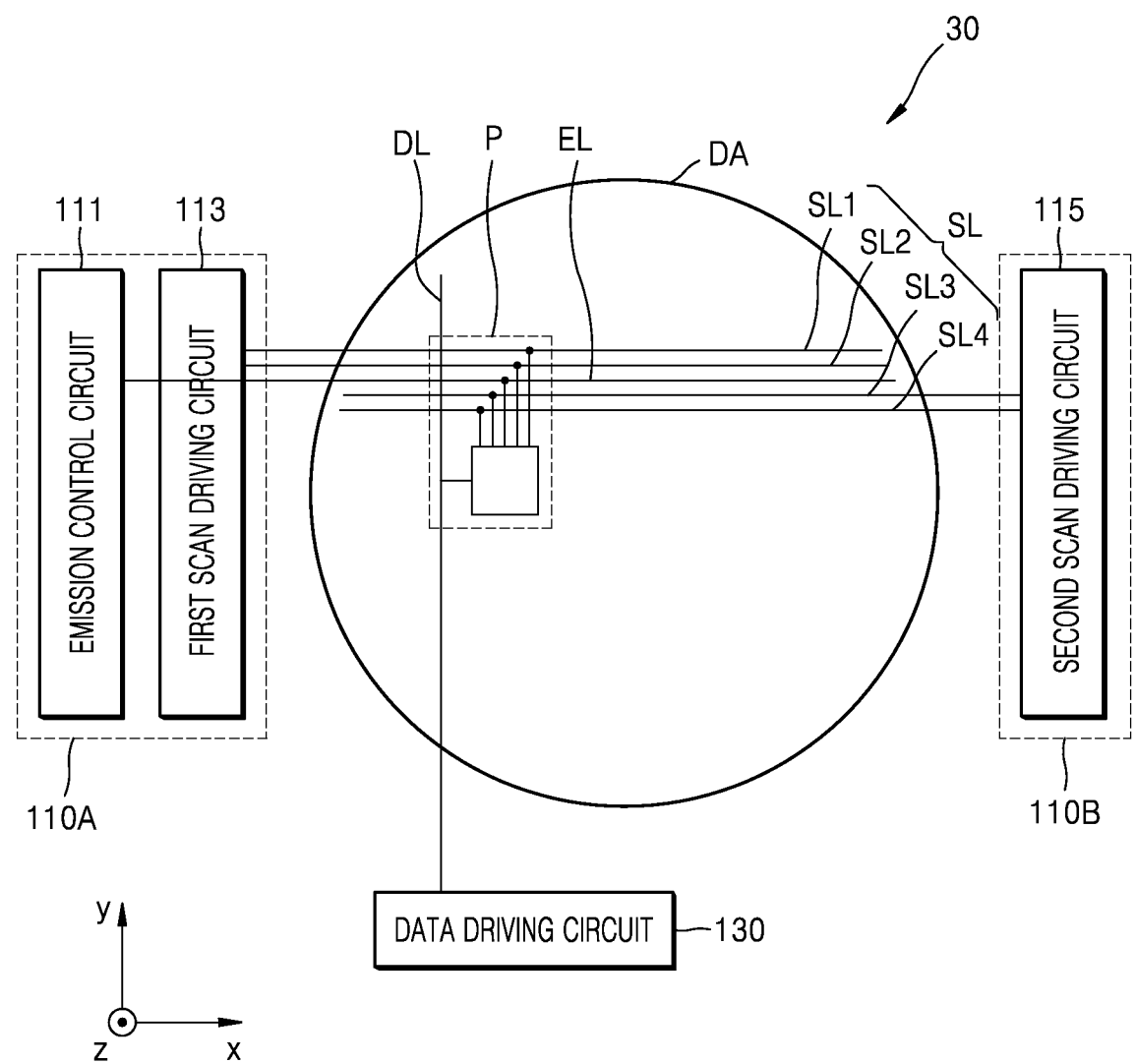
FIG. 3 is a schematic view showing the configuration of a display panel according to some embodiments.

FIG. 3 is a schematic view showing the configuration of the display panel 30 according to some embodiments.

Referring to FIG. 3, the display panel 30 may include the first driving portion 110A, the second driving portion 110B, and the data driving circuit 130 outside the display area DA. The first driving portion 110A and the second driving portion 110B may transmit the same signal or different signals to each pixel P.

According to some embodiments, any one of the first driving portion 110A and the second driving portion 110B may include one or more of an emission control circuit 111, a first scan driving circuit 113, and a second scan driving circuit 115. The other one of the first driving portion 110A and the second driving portion 110B may include the rest of the emission control circuit 111, the first scan driving circuit 113, and the second scan driving circuit 115. For example, as illustrated in FIG. 3, the first driving portion 110A may include the emission control circuit 111 and the first scan driving circuit 113, and the second driving portion 110B may include the second scan driving circuit 115. According to some embodiments, the emission control circuit 111 may be arranged in both of the first driving portion 110A and the second driving portion 110B.

The emission control circuit 111 may be connected to the emission control lines EL, and may generate emission control signals in response to a control signal of a control unit and sequentially provide the generated emission control signals through the emission control lines EL. The emission control line EL may be a gate control signal to turn on or off a plurality of transistors of each pixel P. The emission control circuit 111 may include a plurality of stages (or shift registers) to sequentially generate and output emission control signals.

The first scan driving circuit 113 and the second scan driving circuit 115 may be connected to the scan lines SL, and may generate scan signals in response to the control signal of the control unit and sequentially provide the generated scan signals through the scan lines SL. The scan signal may be a gate control signal in which an on voltage to turn on the transistors of each pixel P and an off voltage to turn off the transistors are repeated. According to some embodiments, the on voltage may be a high-level voltage (or first gate voltage) or a low-level voltage (or second gate voltage). An on-voltage period and an off-voltage period of the scan signal may be determined depending on the function of a transistor in each pixel P that receives the scan signal. The first scan driving circuit 113 and the second scan driving circuit 115 may each include a plurality of stages (or shift registers) that sequentially generate and output scan signals.

According to some embodiments, the scan line SL may include first scan lines SL1, second scan lines SL2, third scan lines SL3, and fourth scan lines SL4, in which the first scan lines SL1 and the second scan lines SL2 may extend from the first driving portion 110A to the pixels P arranged in the display area DA, and the third scan lines SL3 and the fourth scan lines SL4 may extend from the second driving portion 110B to the pixels P arranged in the display area DA.

According to some embodiments, the scan line SL may include the first scan lines SL1, the second scan lines SL2, the third scan lines SL3, and the fourth scan lines SL4, in which the first scan lines SL1 may extend from the first driving portion 110A to the pixels P arranged in the display area DA, and the second scan lines SL2, the third scan lines SL3, and the fourth scan lines SL4 may extend from the second driving portion 110B to the pixels P arranged in the display area DA.

The first scan driving circuit 113 and the second scan driving circuit 115 may each output respective scan signals through the respective scan lines SL. The emission control circuit 111 may output emission control signals EM (see FIG. 4) through the emission control lines EL. The data driving circuit 130 may output data signals DATA (see FIG. 4) through the data lines DL.

As described above, the data driving circuit 130 may be arranged in various methods. For example, the data driving circuit 130 may be arranged directly above the bending portion 103 of the substrate 100 or in a separate flexible printed circuit board that may be electrically connected to the pads.

The scan line SL and the emission control line EL may extend in the first direction (x direction). The scan line SL and the emission control line EL may be shared by the pixels P neighboring in the first direction (x direction). The data line DL may extend in the second direction (y direction). The data line DL may be shared by the pixels P neighboring in the second direction (y direction).

The emission control circuit 111, the first scan driving circuit 113, and the second scan driving circuit 115 may be appropriately arranged in the peripheral area PA along the edge of the display area DA, that is, the periphery of the display area DA. At least one of the emission control circuit 111, the first scan driving circuit 113, or the second scan driving circuit 115 may be arranged in the peripheral area PA (see FIG. 2A) corresponding to the curved side or polygonal side, such as the first corner area CR1 (see FIG. 2A), the second corner area CR2 (see FIG. 2A), the third corner area CR3 (see FIG. 2A), or the fourth corner area CR4 (see FIG. 2A).

Figure 4:
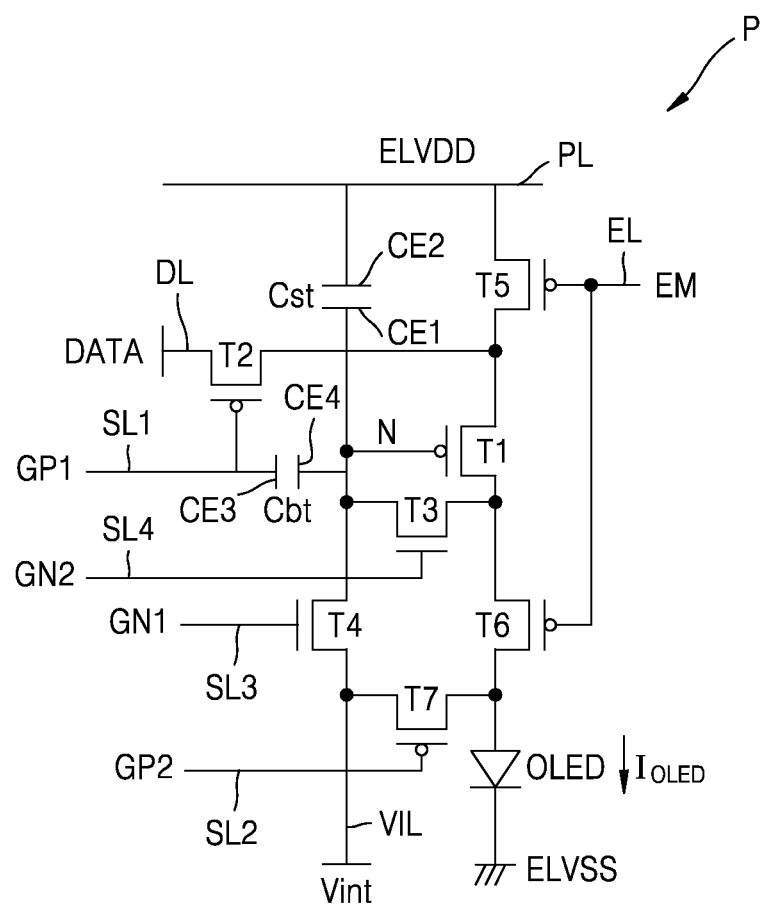
FIG. 4 is an equivalent circuit diagram of a pixel in a display panel according to some embodiments.

FIG. 4 is an equivalent circuit diagram of the pixel P in the display panel 30 according to some embodiments. Although the circuit diagram illustrated in FIG. 4 shows various components, embodiments according to the present disclosure may include additional components or fewer components without departing from the spirit and scope of embodiments according to the present disclosure.

Referring to FIG. 4, each pixel P may include a plurality of first to seventh transistors T1, T2, T3, T4, T5, T6, and T7, a first capacitor Cst, a second capacitor Cbt, an organic light-emitting diode OLED as a display element, and the signal lines SL1, SL2, SL3, SL4, EL, and DL, an initialization voltage line VIL, and a power voltage line PL, which are connected thereto. According to some embodiments, at least any one of the signal lines SL1, SL2, SL3, SL4, EL, and DL, and the initialization voltage line VIL and/or the power voltage line PL may be shared by neighboring pixels. The first to seventh transistors T1 to T7 may be implemented by thin film transistors. In FIG. 4, it is illustrated in, among the first to seventh transistors T1 to T7, the third transistor T3 and the fourth transistor T4 are implemented by an n-channel MOSFET (NMOS), and the other is implemented by a p-channel MOSFET (PMOS).

The signal lines may include the data lines DL, the first scan lines SL1, the second scan lines SL2, the third scan lines SL3, the fourth scan lines SL4, and the emission control lines EL. According to some embodiments, the second scan line SL2 may be connected to the first scan line SL1, and a first scan signal GP1 may be a second scan signal GP2.

The power voltage line PL is configured to transmit a first driving voltage ELVDD to a first transistor T1, and the initialization voltage line VIL may be configured to transmit an initialization voltage Vint for initializing the first transistor T1 and the organic light-emitting diode OLED to each pixel P.

The first scan line SL1, the second scan line SL2, the third scan line SL3, the fourth scan line SL4, the emission control line EL, and the initialization voltage line VIL may extend in the first direction (x direction) (see FIG. 3) and may be arranged in each row apart from each other. The data line DL and the power voltage line PL may extend in the second direction (y direction) (see FIG. 3) and may be arranged in each column apart from each other.

The first transistor T1 may be connected to the power voltage line PL via a fifth transistor T5, and may be electrically connected to the organic light-emitting diode OLED via a sixth transistor T6. The first transistor T1 may serve as a driving transistor, and according to the switching operation of a second transistor T2, receive a data signal DATA and provide a driving current IOLED to the organic light-emitting diode OLED.

The second transistor T2 may be connected to the first scan line SL1 and the data line DL, and connected to the power voltage line PL via the fifth transistor T5. The second transistor T2 may be turned on in response to the first scan signal GP1 received through the first scan line SL1, and may perform a switching operation of transmitting the data signal DATA received through the data line DL to a node N.

The third transistor T3 may be connected to the fourth scan line SL4, and connected to the organic light-emitting diode OLED via the sixth transistor T6. The third transistor T3 may be turned on in response to a fourth scan signal GN2 received through the fourth scan line SL4 and may make the first transistor T1 diode-connected.

The fourth transistor T4 may be connected to the third scan line SL3 and the initialization voltage line VIL, and turned on in response to a third scan signal GN1 received through the third scan line SL3 to transmit the initialization voltage Vint from the initialization voltage line VIL to a gate electrode of the first transistor T1, thereby initializing the voltage of the gate electrode of the first transistor T1.

The fifth transistor T5 and the sixth transistor T6 may be connected to the emission control line EL, and simultaneously turned on in response to an emission control signal EM received through the emission control line EL to form a current path so that the driving current IOLED may flow in a direction from the power voltage line PL to the organic light-emitting diode OLED, A seventh transistor T7 may be connected to the second scan line SL2 and the initialization voltage line VIL, and turned on in response to the second scan signal GP2 received through the second scan line SL2 to transmit the initialization voltage Vint from the initialization voltage line VIL to the organic light-emitting diode OLED, thereby initializing the organic light-emitting diode OLED. The seventh transistor T7 may be omitted.

The first capacitor Cst may include a first electrode CE1 and a second electrode CE2. The first electrode CE1 may be connected to the gate electrode of the first transistor T1, and the second electrode CE2 may be connected to the power voltage line PL. The first capacitor Cst may store and maintain a voltage corresponding to a voltage difference between opposite ends of the power voltage line PL and the gate electrode of the first transistor T1, thereby maintaining the voltage applied to the gate electrode of the first transistor T1.

The second capacitor Cbt may include a third electrode CE3 and a fourth electrode CE4. The third electrode CE3 may be connected to the first scan line SL1 and a gate electrode of the second transistor T2. The fourth electrode CE4 may be connected to the gate electrode of the first transistor T1 and the first electrode CE1 of the first capacitor Cst. The second capacitor Cbt, as a boosting capacitor, when the first scan signal GP1 of the first scan line SL1 is a voltage to turn off the second transistor T2, may decrease a voltage (black voltage) to display black by increasing the voltage of the node N.

The organic light-emitting diode OLED may include a pixel electrode and a counter electrode, and the counter electrode may receive a second power voltage ELVSS. The organic light-emitting diode OLED may display an image by receiving the driving current IOLED from the first transistor T1 and emitting light.

A specific operation of each pixel P according to some embodiments is described as follows.

During an initialization period, when the third scan signal GN1 is provided through the third scan line SL3, the fourth transistor T4 may be turned on in response to the third scan signal GN1, and the first transistor T1 may be initialized by the initialization voltage Vint received through the initialization voltage line VIL.

During a data programming period, when the first scan signal GP1, the second scan signal GP2, and the fourth scan signal GN2 are provided through the first scan line SL1, the second scan line SL2, and the fourth scan line SL4, respectively, the second transistor T2, the seventh transistor T7, and the third transistor T3 may be turned on in response to the first scan signal GP1, the second scan signal GP2, and the fourth scan signal GN2. In this state, the first transistor T1 may be diode-connected by the third transistor T3 that is turned on, and biased in a forward direction.

Then, a voltage in which a threshold voltage Vth of the first transistor T1 is compensated from the data signal DATA supplied from the data line DL, is applied to the gate electrode of the first transistor T1. The organic light-emitting diode OLED may be initialized by the initialization voltage Vint received through the initialization voltage line VIL by the seventh transistor T7 that is turned on. The first driving voltage ELVDD and compensation voltage may be applied to opposite ends of the first capacitor Cst, and electric charges corresponding to voltage difference between opposite ends may be stored in the first capacitor Cst.

During an emission period, the fifth transistor T5 and the sixth transistor T6 may be turned on in response to the emission control signal EM provided through the emission control line EL. The driving current IOLED according to the voltage difference between the voltage of the gate electrode of the first transistor T1 and the first driving voltage ELVDD may be generated, and the driving current IOLED may be provided to the organic light-emitting diode OLED through the sixth transistor T6.

According to some embodiments, at least one of the transistors T1 to T7 may include a semiconductor layer including an oxide, and the other transistors may include a semiconductor layer including silicon. For example, the first transistor having a direct influence on the brightness of a display apparatus may include a semiconductor layer including polycrystalline silicon exhibiting high reliability, and thus, a display apparatus with a relatively high resolution may be implemented.

As an oxide semiconductor has high carrier mobility and a low leakage current, a voltage drop is not much in spite of a long driving time. In other words, as a color change of an image according to a voltage drop is not much even in low frequency driving, low frequency driving is possible. As such, as an oxide semiconductor may have a relatively low leakage current, at least one of the third transistor T3 or the fourth transistor T4 connected to the gate electrode of the first transistor T1 may be employed as an oxide semiconductor, a leakage current that may flow to the gate electrode of the first transistor T1 may be prevented or reduced and simultaneously power consumption may be relatively reduced.

Figure 5:
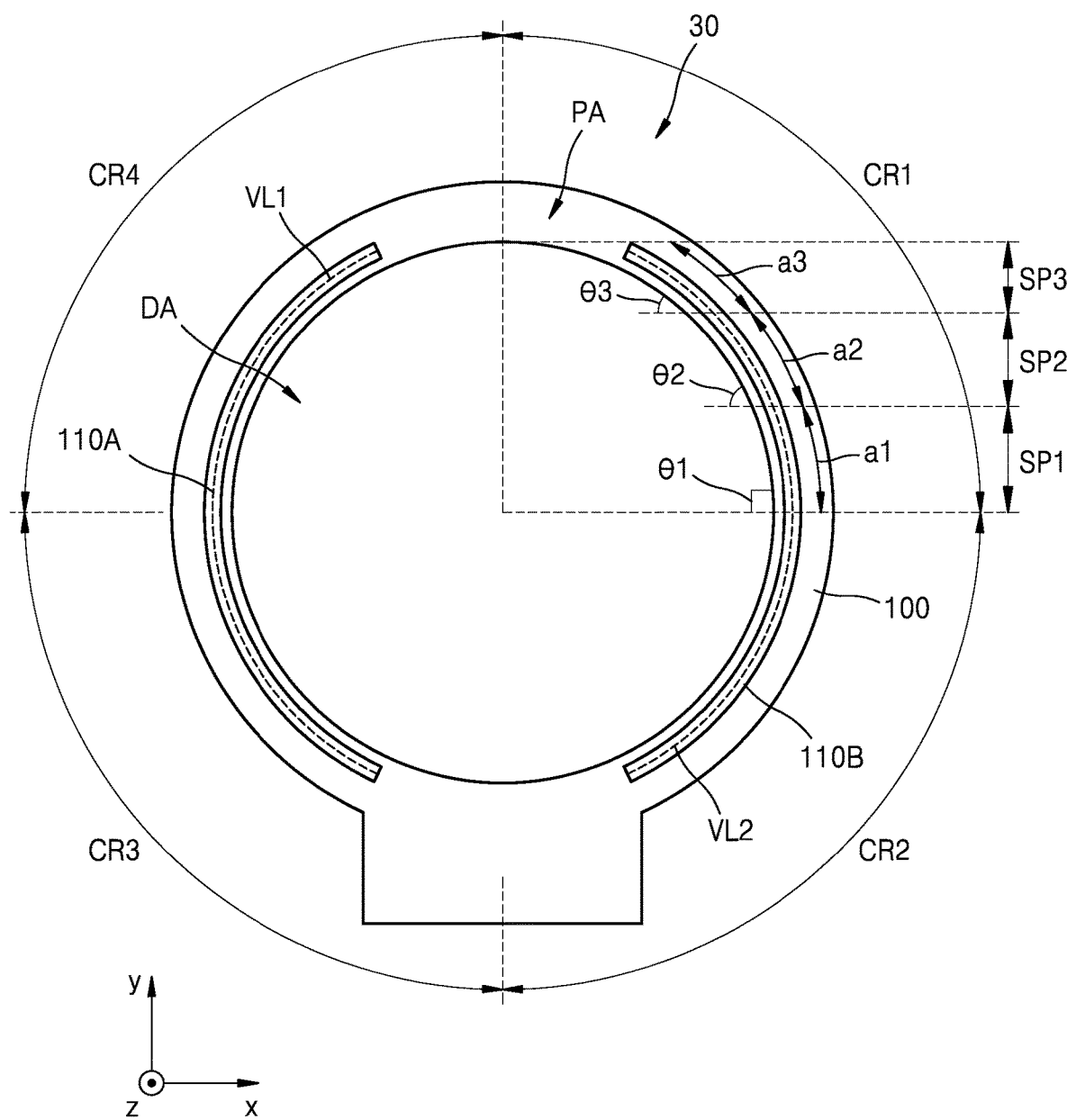
FIG. 5 is a schematic plan view of a driving portion in a display panel according to some embodiments.
Figure 6:
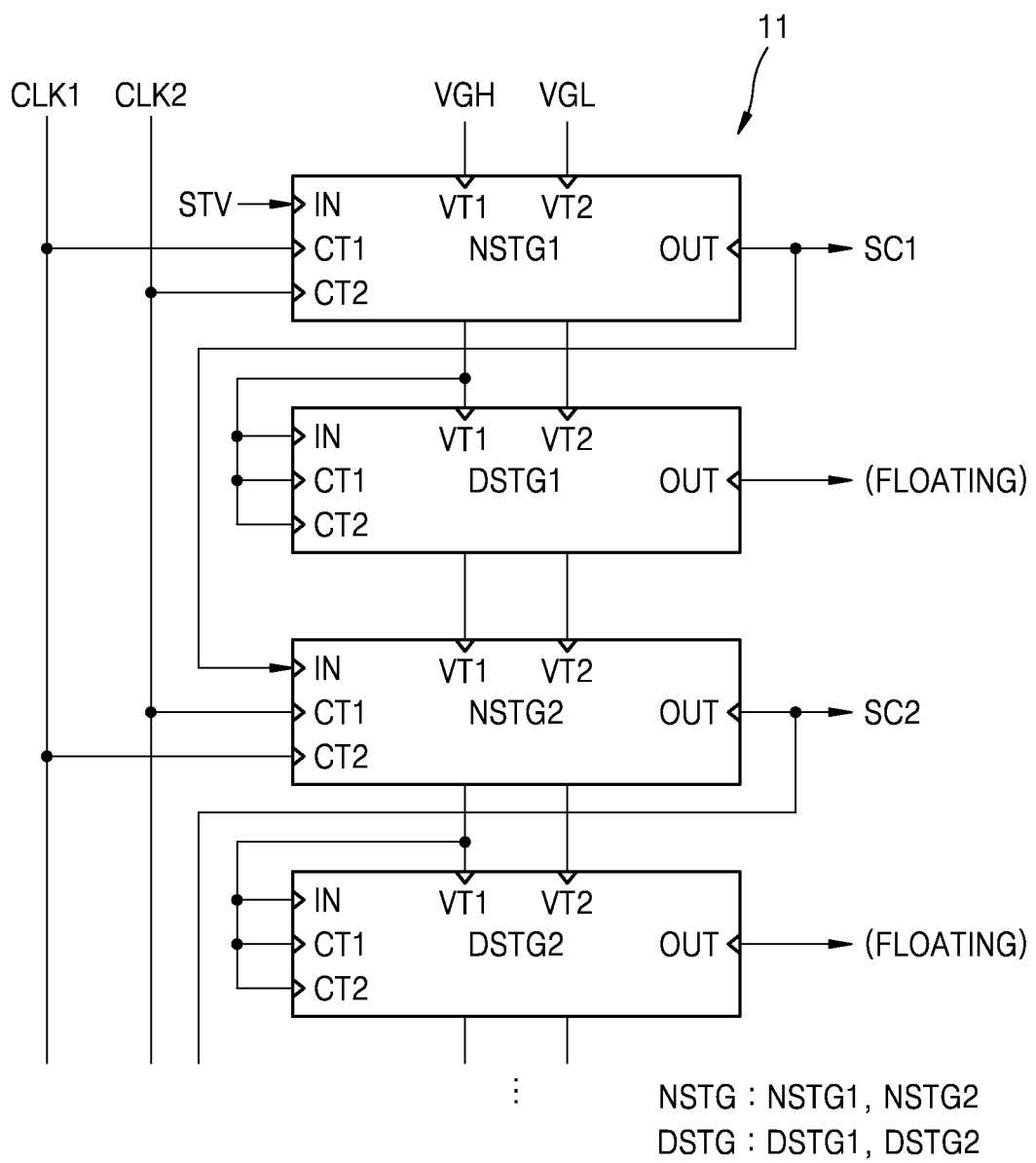
FIG. 6 is a schematic block diagram of a driving portion in a display panel according to some embodiments.

FIG. 5 is a schematic plan view of a driving portion in the display panel 30 according to some embodiments, and FIG. 6 is a schematic block diagram of a driving portion in the display panel 30 according to some embodiments.

Referring to FIGS. 5 and 6, at least portions of the first driving portion 110A and the second driving portion 1106 may be arranged in the first corner area CR1, the second corner area CR2, the third corner area CR3, and the fourth corner area CR4 corresponding to curved sides or polygonal sides.

The first driving portion 110A and the second driving portion 1106 may each include a plurality of normal stages NSTG and a plurality of dummy stages DSTG. Each of the normal stages NSTG may correspond to a pixel row provided in the display area DA. The number of the normal stages NSTG arranged in the first driving portion 110A and the second driving portion 1106 may be variously changed according to the number of pixel rows.

The normal stages NSTG may output a plurality of output signals in response to a start signal. For example, a first normal stage NSTG1 may output a first output signal SC1, a second normal stage NSTG2 may output a second output signal SC2, and the n-th normal stage may output the n-th output signal.

Each of the normal stages NSTG may include an input terminal IN, a first clock terminal CT1, a second clock terminal CT2, a first power terminal VT1, a second power terminal VT2, and an output terminal OUT.

The input terminal IN may receive, as a start signal, an external start signal STV or a carry signal output from the preceding normal stage NSTG. According to some embodiments, the external start signal STV may be applied to the input terminal IN of the first normal stage NSTG1, and from the second normal stage NSTG2, a carry signal (previous carry signal) output by the preceding normal stage NSTG may be applied to the input terminal IN. The previous carry signal may be a carry signal output by the preceding stage that is adjacent thereto. For example, the first normal stage NSTG1 may start driving in response to the external start signal STV, and the carry signal output from the first normal stage NSTG1 may be input to the input terminal IN of the second normal stage NSTG2.

A first clock signal CLK1 or a second clock signal CLK2 may be applied to the first clock terminal CT1 and the second clock terminal CT2. The first clock signal CLK1 and the second clock signal CLK2 may be alternately applied to the normal stages NSTG. For example, the first clock signal CLK1 may be applied to the first clock terminal CT1 of odd-numbered normal stages, and the second clock signal CLK2 may be applied to the second clock terminal CT2 of the odd-numbered normal stages. The second clock signal CLK2 may be applied to the first clock terminal CT1 of even-numbered normal stages, and the second clock signal CLK2 may be applied to the second clock terminal CT2 of the even-numbered normal stages.

The first power terminal VT1 may receive a first gate voltage VGH of a high voltage, and the second power terminal VT2 may receive a second gate voltage VGL of a low voltage. The first gate voltage VGH and the second gate voltage VGL, as global signals, may be provided from a control unit, a power supply unit, and/or like.

The output terminal OUT may output output signals such as the first output signal SC1, the second output signal SC2, and the like. The first output signal SC1 and the second output signal SC2 may be scan signals. Each output signal may be provided to a pixel P (see FIG. 3) through a corresponding output line, for example, the scan line SL (see FIG. 3).

The dummy stages DSTG may each include the input terminal IN, the first clock terminal CT1, the second clock terminal CT2, the first power terminal VT1, the second power terminal VT2, and the output terminal OUT.

The dummy stages DSTG are arranged to improve the uniformity of a pattern density of the first driving portion 110A and the second driving portion 1106, and do not output output signals. In other words, the output terminal OUT of the dummy stages DSTG may be floating. In order to reduce the occurrence of defects due to static electricity because electric charges are introduced into the dummy stages DSTG, the input terminal IN, the first clock terminal CT1, and the second clock terminal CT2 of each of the dummy stages DSTG may receive the first gate voltage VGH. Furthermore, the first power terminal VT1 of each of the dummy stages DSTG may receive the first gate voltage VGH, and the second power terminal VT2 may receive the second gate voltage VGL.

Although FIG. 6 illustrates that the first normal stage NSTG1, a first dummy stage DSTG1, the second normal stage NSTG2, and a second dummy stage DSTG2 are sequentially arranged, the number of the dummy stages DSTG arranged between the normal stages NSTG neighboring each other may vary according to the arrangement position. For example, one or more dummy stages DSTG may be arranged between the normal stages NSTG neighboring each other, or the normal stages NSTG may be arranged adjacent to each other without the dummy stage DSTG therebetween.

According to some embodiments, the first driving portion 110A may be arranged in the third corner area CR3 and the fourth corner area CR4, and arranged along a first virtual line VL1 corresponding to a curved side (or a polygonal side). In other words, the normal stages NSTG and the dummy stages DSTG in the first driving portion 110A may be arranged along the first virtual line VL1. At this time, the number of dummy stages arranged for each unit length of the first virtual line VL1 may be determined based on an angle between the first virtual line VL1 and the first direction (x direction).

Likewise, the second driving portion 110B may be arranged in the first corner area CR1 and the second corner area CR2, along a second virtual line VL2 corresponding to a curved side (or a polygonal side). In other words, the normal stages NSTG and the dummy stages DSTG in the second driving portion 110B may be arranged along the second virtual line VL2. At this time, the number of dummy stages arranged for each unit length of the second virtual line VL2 may be determined based on an angle formed between the second virtual line VL2 and the first direction (x direction).

When a portion of the second virtual line VL2 is divided into three of a first arc a1, a second arc a2, and a third arc a3 with the same arc length, a first length SP1 that is the length of the first arc a1 in the second direction (y direction), a second length SP2 that is the length of the second arc a2 in the second direction (y direction), and a third length SP3 that is the length of the third arc a3 in the second direction (y direction) may be different from one another.

The tangent line of the first arc a1 may form a first angle θ1 with the first direction (x direction), the tangent line of the second arc a2 may form a second angle θ2 with the first direction (x direction), and the tangent line of the third arc a3 may form a third angle θ3 with the first direction (x direction). When the first angle θ1 is greater than the second angle θ2, and the second angle θ2 is greater than the third angle θ3, the first length SP1 may be greater than the second length SP2, and the second length SP2 may be greater than the third length SP3.

As the stages including the normal stages NSTG and the dummy stages DSTG are arranged along the second virtual line VL2, the same number of stages may be arranged in each of the first arc a1, the second arc a2, and the third arc a3. In contrast, the number of pixel rows arranged in the display area DA corresponding to the first length SP1 may be greater than the number of pixel rows arranged in the display area DA corresponding to the second length SP2, and the number of pixel rows arranged in the display area DA corresponding to the second length SP2 may be greater than the number of pixel rows arranged in the display area DA corresponding to the third length SP3. Accordingly, the number of the normal stages NSTG arranged along the first arc a1 may be greater than the number of the normal stages NSTG arranged along the second arc a2, and the number of the normal stages NSTG arranged along the second arc a2 may be greater than the number of the normal stages NSTG arranged along the third arc a3. In order to the uniformity of a pattern density of the second driving portion 110B, the number of the dummy stages DSTG arranged along the first arc a1 may be less than the number of the dummy stages DSTG arranged along the second arc a2, and the number of the dummy stages DSTG arranged along the second arc a2 may be less than the number of the dummy stages DSTG arranged along the third arc a3. The normal stages NSTG and the dummy stages DSTG of the first driving portion 110A may be arranged in the same rule.

In a comparative example, when a first driving portion and a second driving portion include only normal stages for outputting output signals, it may be difficult to arrange normal stages with a uniform pattern density of the first driving portion and the second driving portion. Accordingly, due to a pattern density difference between stages, the timing of output signals output from the first driving portion and the second driving portion may be advanced or delayed. In contrast, in the display panel 30 according to some embodiments, the dummy stages DSTG are arranged between the normal stages NSTG to have a uniform pattern density of each of the first driving portion 110A and the second driving portion 110B, and thus, the first driving portion 110A and the second driving portion 110B may output output signals at an accurate timing.

Figure 7:
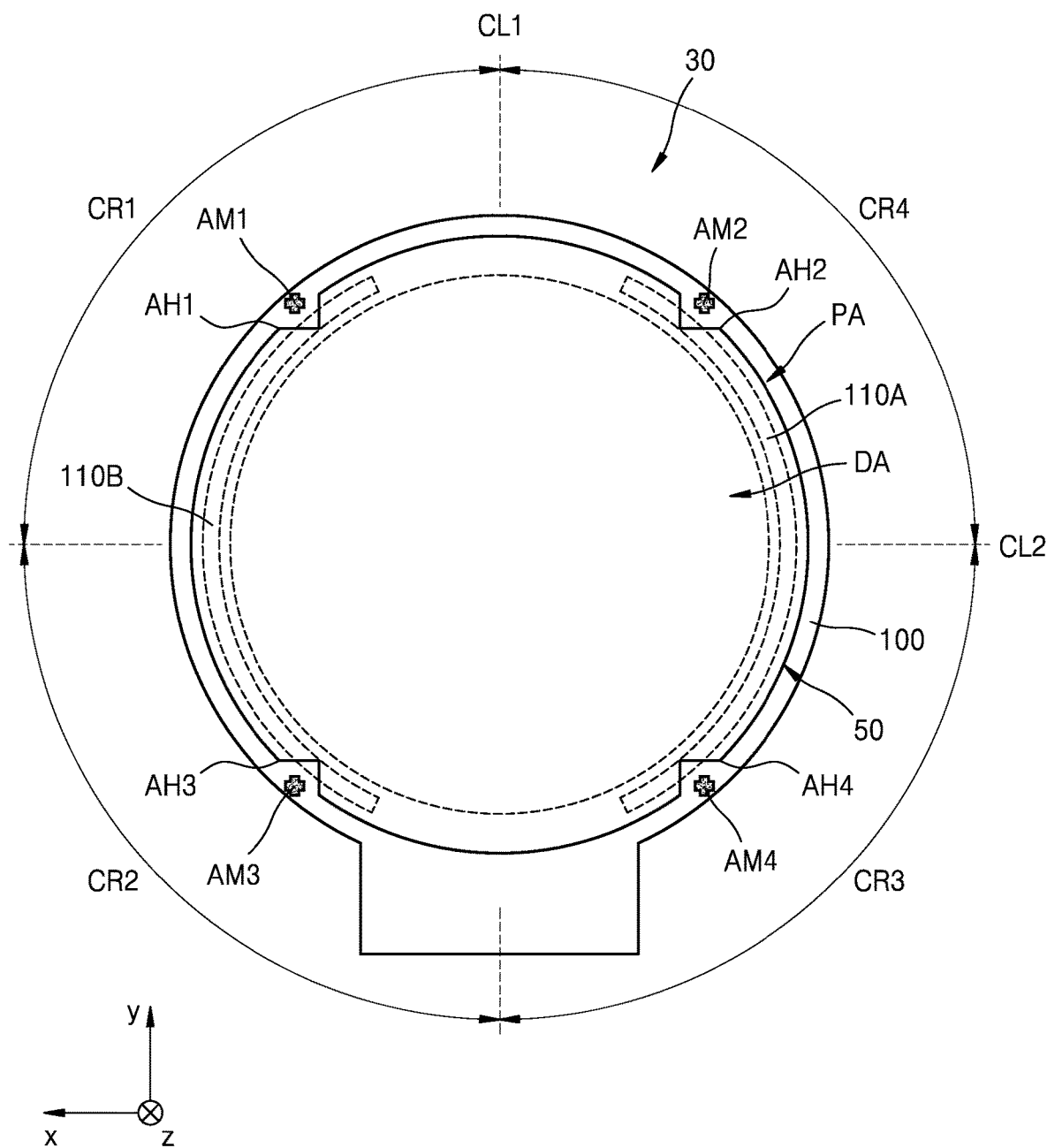
FIG. 7 is a schematic plan view of a display panel and a cover panel, according to some embodiments.
Figure 8:
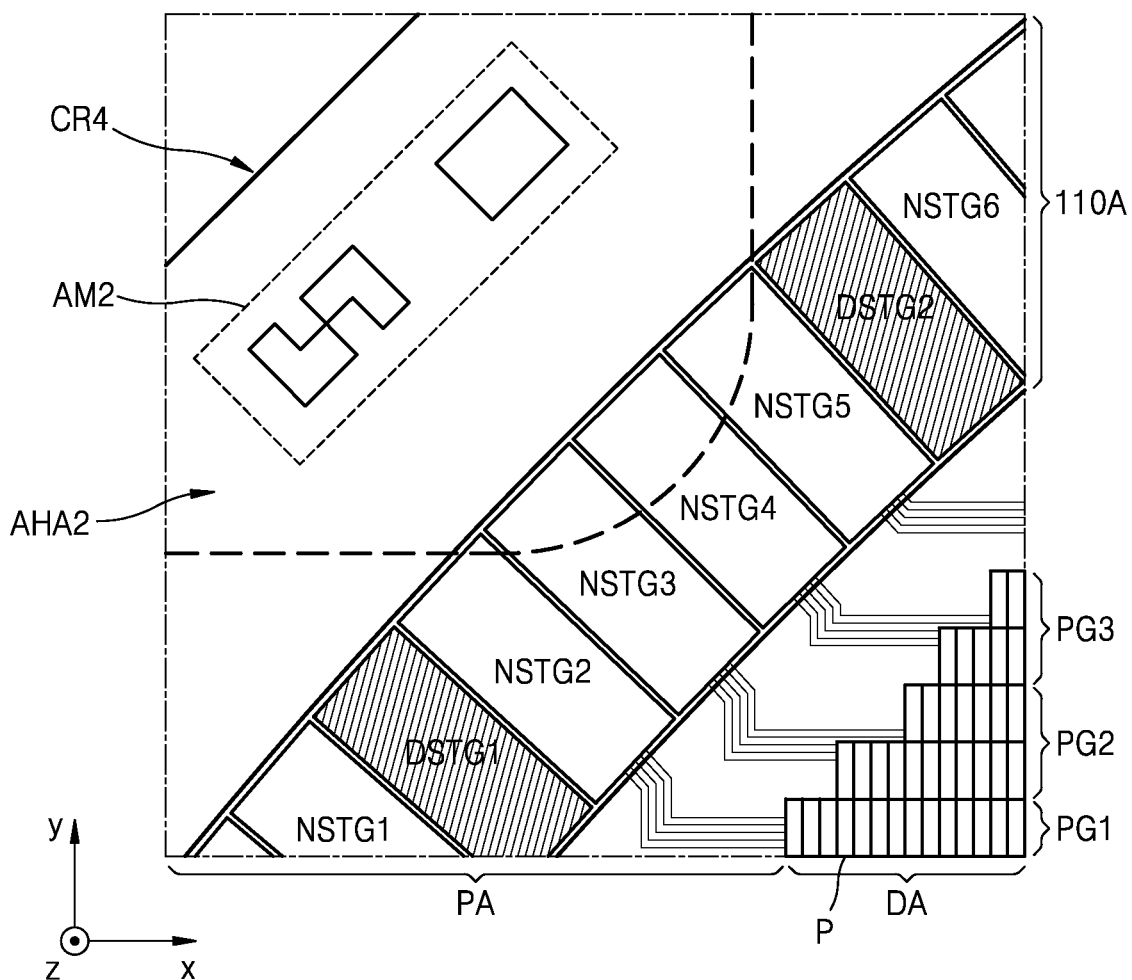
FIG. 8 is a schematic enlarged plan view of a portion of a display panel according to a comparative example.
Figure 9:
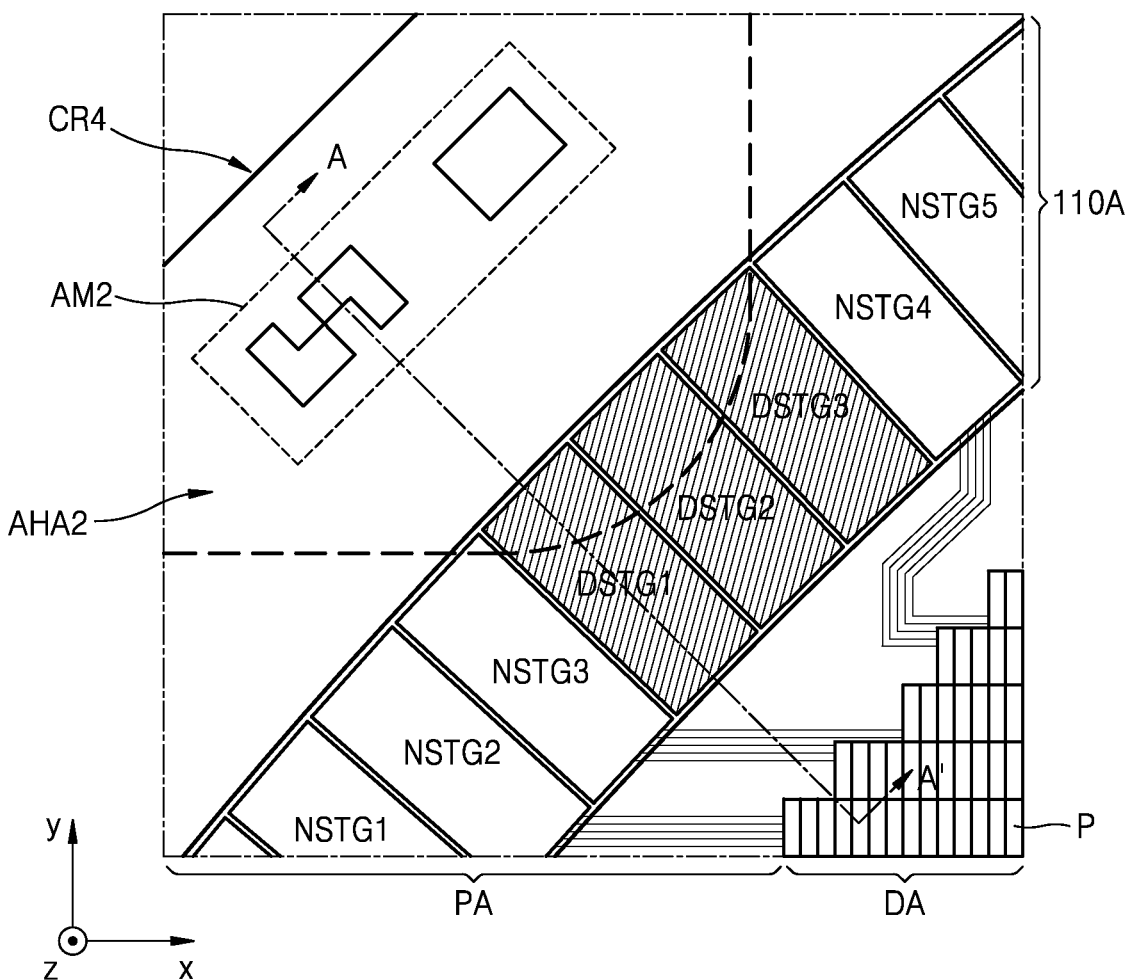
FIG. 9 is a schematic enlarged plan view of a portion of a display panel according to some embodiments.

FIG. 7 is a schematic plan view of the display panel 30 and the cover panel 50 according to some embodiments, FIG. 8 is a schematic enlarged plan view of a portion of the display panel 30 according to a comparative example, and FIG. 9 is a schematic enlarged plan view of a portion of the display panel 30 according to some embodiments.

FIG. 7 illustrates the display panel 30 and the cover panel 50 when viewed from a direction (−z direction) perpendicular to the display panel 30, showing that the cover panel 50 is bonded to the rear surface of the display panel 30. FIGS. 8 and 9 are schematic enlarged plan views of a portion of a display panel according to a comparative example and a portion of the display panel 30 according to some embodiments, when viewed from a direction (+z direction) perpendicular to the display panel 30 (e.g., from a direction perpendicular or normal with respect to a display surface of the display panel 30, or in a plan view), to explain the arrangement of a second alignment notch AH2 and the first driving portion 110A in the fourth corner area CR4.

Referring to FIGS. 7 to 9, the cover panel 50 may have a shape corresponding to the display panel 30. As described above, the cover panel 50 may be implemented by a film or a plate-shaped member including any one or more of a light absorption layer, a buffer member, and a heat dissipation member.

The cover panel 50 may have the same size (or area) as or a different size (or area) from the display panel 30. According to some embodiments, the size (or area) of the cover panel 50 may be less than the size (or area) of the display panel 30. Accordingly, the edge of the cover panel 50 may be spaced apart a certain distance inwards from the edge of the display panel 30. According to some embodiments, the size (or area) of the cover panel 50 may be the same as or greater than the size (or area) of the display panel 30. The edge of the cover panel 50 may be located outside the first driving portion 110A and the second driving portion 110B. Accordingly, when viewed from the rear surface of the display panel 30, the cover panel 50 may cover an area corresponding to the first driving portion 110A and the second driving portion 110B.

The cover panel 50 may have a first alignment notch AH1 corresponding to the first alignment mark AM1, the second alignment notch AH2 corresponding to the second alignment mark AM2, a third alignment notch AH3 corresponding to the third alignment mark AM3, and a fourth alignment notch AH4 corresponding to the fourth alignment mark AM4. In other words, the first alignment notch AH1 may be formed in the edge of the cover panel 50 corresponding to the first corner area CR1, the second alignment notch AH2 may be formed in the edge of the cover panel 50 corresponding to the fourth corner area CR4, the third alignment notch AH3 may be formed in the edge of the cover panel 50 corresponding to the second corner area CR2, and the fourth alignment notch AH4 may be formed in the edge of the cover panel 50 corresponding to the third corner area CR3. In some embodiments, some of the first alignment notch AH1, the second alignment notch AH2, the third alignment notch AH3, and the fourth alignment notch AH4 may be omitted.

The first alignment mark AM1, the second alignment mark AM2, the third alignment mark AM3, and the fourth alignment mark AM4 may be arranged on the front surface of the display panel 30, and may include an opaque material. For example, the first alignment mark AM1, the second alignment mark AM2, the third alignment mark AM3, and the fourth alignment mark AM4 may include a metal material.

The first alignment notch AH1, the second alignment notch AH2, the third alignment notch AH3, and the fourth alignment notch AH4 of the cover panel 50 may be used as identification marks for alignment, during the assembly of the display panel and the cover panel 50, with the first alignment mark AM1, the second alignment mark AM2, the third alignment mark AM3, and the fourth alignment mark AM4.

As the display area DA expands so that the size of the peripheral area PA decreases, the first alignment notch AH1, the second alignment notch AH2, the third alignment notch AH3, and the fourth alignment notch AH4 may overlap the first driving portion 110A and the second driving portion 110B in a thickness direction (z-axis direction). In other words, portions of the first driving portion 110A and the second driving portion 110B may be exposed from the cover panel 50 by the first alignment notch AH1, the second alignment notch AH2, the third alignment notch AH3, and the fourth alignment notch AH4.

As the first alignment mark AM1, the second alignment mark AM2, the third alignment mark AM3, and the fourth alignment mark AM4 are substantially the same as or similar to each other, and the first alignment notch AH1, the second alignment notch AH2, the third alignment notch AH3, and the fourth alignment notch AH4 are substantially the same as or similar to each other, a case in which the second alignment mark AM2 and the second alignment notch AH2 arranged in the fourth corner area CR4 is mainly described below.

Areas in which the substrate 100 of the display panel 30 overlaps the first alignment notch AH1, the second alignment notch AH2, the third alignment notch AH3, and the fourth alignment notch AH4 of the cover panel 50 in the thickness direction (z-axis direction) may be defined as notch areas AHA. Accordingly, the notch areas AHA may be arranged to respectively overlap the first alignment mark AM1, the second alignment mark AM2, the third alignment mark AM3, and the fourth alignment mark AM4.

The notch area AHA may overlap portions of the first driving portion 110A and the second driving portion 110B. Referring to FIGS. 8 and 9, the first driving portion 110A may include the normal stages NSTG and the dummy stages DSTG. The normal stage NSTG may include the first normal stage NSTG1 to a sixth normal stage NSTG6, and the dummy stage DSTG may include the first dummy stage DSTG1 to a third dummy stage DSTG3. The disclosure is not limited thereto, and the numbers of the normal stages NSTG and the dummy stages DSTG may be changed variously.

As a comparative example, as illustrated in FIG. 8, when the notch area AHA overlaps portions of the normal stages NSTG, a pixel row connected to a normal stage that overlaps the notch area AHA may have different light-emitting characteristics from a pixel row connected to a normal stage that does not overlap the notch area AHA. For example, in FIG. 8, a third normal stage NSTG3, a fourth normal stage NSTG4, and a fifth normal stage NSTG5 of the first driving portion 110A may overlap the notch area AHA. A second pixel group PG2 connected to the third normal stage NSTG3 and a third pixel group PG3 connected to the fourth normal stage NSTG4 may have different light-emitting characteristics from a first pixel group PG1 connected to the second normal stage NSTG2. Accordingly, in the display apparatus according to a comparative example, a user may perceive a horizontal stain across the display area DA in the first direction (x direction).

In contrast, according to one or more embodiments, the dummy stages DSTG may be arranged in the notch area AHA. For example, the first dummy stage DSTG1, the second dummy stage DSTG2, and the third dummy stage DSTG3 may be arranged between the third normal stage NSTG3 and the fourth normal stage NSTG4, and the notch area AHA may be arranged to overlap the first dummy stage DSTG1, the second dummy stage DSTG2, and the third dummy stage DSTG3. As the output terminals OUT (see FIG. 6) of the dummy stages DSTG may be floating, the dummy stages DSTG may not be electrically connected to each pixel P. As the normal stages NSTG electrically connected to the pixels P do not overlap the notch area AHA, the display apparatus according to one or more embodiments may display a high-quality image having no horizontal stain.

Figure 10:
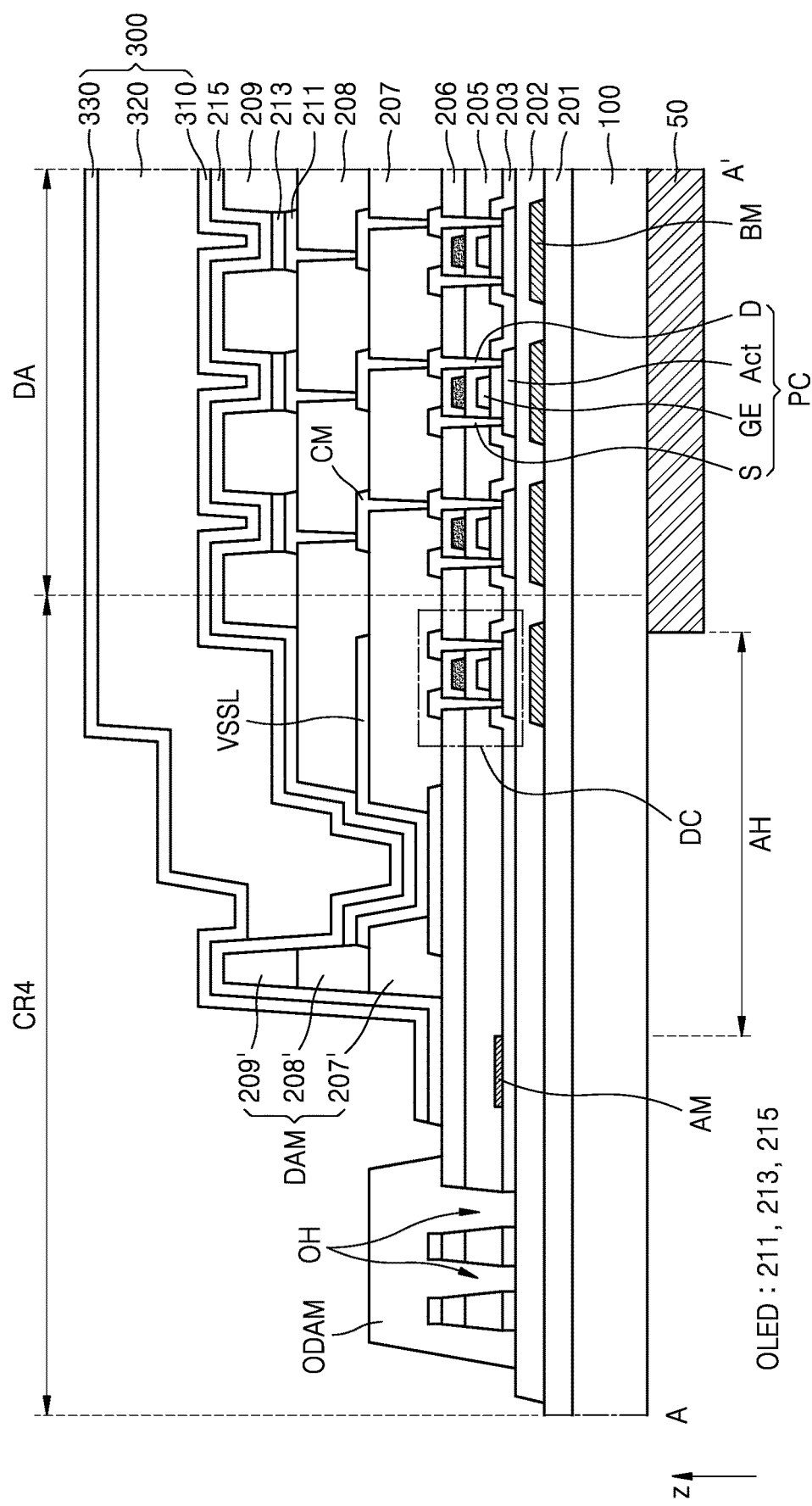
FIG. 10 is a schematic cross-sectional view of the display panel illustrated in FIG. 9 taken along the line A-A' according to some embodiments.

FIG. 10 is a schematic cross-sectional view of the display panel 30 illustrated in FIG. 9 taken along the line A-A'.

Referring to FIG. 10, the display panel 30 of the display apparatus may include the substrate 100 including the display area DA and the peripheral area PA. A first buffer layer 201 and a second buffer layer 202 may be arranged in the display area DA of the substrate 100. The first buffer layer 201 and the second buffer layer 202 may serve to increase smoothness of the upper surface of the substrate 100, and may prevent or reduce infiltration of impurities from the substrate 100 and the like into a semiconductor layer Act. The first buffer layer 201 and the second buffer layer 202 may be provided as an oxide film such as SiOx, and/or a nitride film such as SiNx or a SiON.

According to some embodiments, a light blocking layer BM may be arranged between the first buffer layer 201 and the second buffer layer 202. The light blocking layer BM may include a metal material. The metal material may include any one of molybdenum (Mo), aluminum (Al), chromium (Cr), gold (Au), titanium (Ti), nickel (Ni), neodymium (Nd), and copper (Cu), or an alloy thereof.

A pixel circuit PC may be located on the second buffer layer 202. The pixel circuit PC may include the semiconductor layer Act, a gate electrode GE, a source electrode S, a drain electrode D, and a capacitor electrode CE. The semiconductor layer Act may include a silicon semiconductor or an oxide semiconductor. The semiconductor layer Act may include a source region and a drain region, which are doped with impurities, are conductive, and are apart from each other, and a channel region arranged therebetween. The source region and the drain region may be electrically connected to the source electrode S and the drain electrode D, respectively.

The gate electrode GE may be located on the semiconductor layer Act, and a first gate insulating layer 203 may be located between the semiconductor layer Act and the gate electrode GE.

The gate electrode GE may be arranged to overlap the channel region of the semiconductor layer Act, and may include at least one of Mo, Cu, Ti, or Al.

A second gate insulating layer 205 may be located on the gate electrode GE, the capacitor electrode CE may be located on the second gate insulating layer 205, and a first planarization layer 207 may be located on the capacitor electrode CE. The source electrode S and the drain electrode D may be located on an interlayer insulating layer 206. The source electrode S may be connected to the source region of the semiconductor layer Act through a contact hole penetrating the interlayer insulating layer 206, the second gate insulating layer 205, and the first gate insulating layer 203, and the drain electrode D may be connected to the drain region of the semiconductor layer Act through a contact hole penetrating the interlayer insulating layer 206, the second gate insulating layer 205, and the first gate insulating layer 203.

The first gate insulating layer 203, the second gate insulating layer 205, and the interlayer insulating layer 206 may include an inorganic material including an oxide or a nitride. For example, the first gate insulating layer 203, the second gate insulating layer 205, and the interlayer insulating layer 206 may include at least one of $SiO_2$, SiNx, SiON, an aluminum oxide ($Al_2O_3$), a titanium oxide ($TiO_2$), a tantalum oxide ($Ta_2O_5$), a hafnium oxide ($HfO_2$), or a zinc oxide ($ZnO_2$).

The first planarization layer 207 may be arranged to cover the source electrode S and the drain electrode D, and a second planarization layer 208 may be located on the first planarization layer 207. According to some embodiments, the second planarization layer 208 may be omitted. According to some embodiments, a third planarization layer may be located on the second planarization layer 208. The first planarization layer 207 and/or the second planarization layer 208 may include an organic material, such as acryl, benzocyclobutene (BCB), polyimide, hexamethyldisiloxane (HMDSO), or the like. Alternatively, the first planarization layer 207 and/or the second planarization layer 208 may include an inorganic material.

The organic light-emitting diode OLED, as a display element, may be located on the second planarization layer 208. The organic light-emitting diode OLED may include a pixel electrode 211, a counter electrode 215, and an intermediate layer 213 arranged between the pixel electrode 211 and the counter electrode 215 and including a light-emitting layer.

The pixel electrode 211 may be connected to a connection electrode CM through a contact hole penetrating the second planarization layer 208, and the connection electrode CM may be connected to the drain electrode D or the source electrode S through a contact penetrating the first planarization layer 207.

A pixel define layer 209 may be located on the second planarization layer 208. The pixel define layer 209 may have an opening corresponding to each pixel, that is, an opening to expose a portion of the pixel electrode 211, thereby performing a function to define a pixel. Furthermore, the pixel define layer 209 may prevent or reduce generation of arc and the like in the edge of the pixel electrode 211, by increasing a distance between an edge of the pixel electrode 211 and the counter electrode 215. The pixel define layer 209 may include an organic insulating material, such as BCB, polyimide, HMDSO, or the like. According to some embodiments, the pixel define layer 209 may include a light blocking material, and may be provided in black. The light blocking material may include carbon black, carbon nanotube, resin or paste including black dye, a metal particle, for example, Ni, Al, Mo, and an alloy thereof, a metal oxide particle, for example, a chromium oxide, or a metal nitride particle, for example, a chromium nitride, and the like.

The intermediate layer 213 may include a light-emitting layer overlapping the pixel electrode 211. The light-emitting layer may include a polymer organic material or a low molecular weight organic material emitting light of a certain color. The light-emitting layer may be patterned to correspond to the pixel electrode 211 through a deposition process using a mask. The intermediate layer 213 may further include a functional layer located below and/or above the light-emitting layer.

The counter electrode 215 may include a conductive material having a relatively work function. For example, the counter electrode 215 may include a (semi-) transparent layer including silver (Ag), magnesium (Mg), Al, Ni, Cr, lithium (Li), calcium (Ca), or an alloy thereof, and the like. Alternatively, a counter electrode 230 may further include a layer such as ITO, IZO, ZnO or $In_2O_3$ on the (semi-) transparent layer including the materials described above. The counter electrode 215, unlike the pixel electrode 211, may be integrally provided on the entire surface of the display area DA.

An encapsulation layer 300 may be located on the organic light-emitting diode OLED. According to some embodiments, the encapsulation layer 300 may include at least one inorganic encapsulation layer and at least one organic encapsulation layer. For example, the encapsulation layer 300 may include first and second inorganic encapsulation layers 310 and 330 and an organic encapsulation layer 320 arranged therebetween.

The first and second inorganic encapsulation layers 310 and 330 may each include one or more inorganic insulating materials. The inorganic insulating material may include $Al_2O_3$, $TiO_2$, $Ta_2O_5$, $HfO_2$, ZnO, $SiO_x$, $SiN_x$, or/and SiON. The first and second inorganic encapsulation layers 310 and 330 may be formed through a chemical vapor deposition method.

The organic encapsulation layer 320 may further include polyethylene terephthalate, polyethylene naphthalate, polycarbonate, polyimide, polyethylene sulfonate, polyoxymethylene, polyarylate, hexamethyldisiloxane, acrylic resin, for example, polymethyl methacrylate, polyacrylic acid, and the like, or a combination thereof.

The peripheral area PA may be located outside the display area DA, and the peripheral area PA may include the fourth corner area CR4 having a curved side or a polygonal side. A driving circuit DC and a power wire VSSL may be arranged in the fourth corner area CR4. The driving circuit DC may be the dummy stage DSTG in the first driving portion 110A.

The cover panel 50 arranged on the rear surface of the substrate 100 in the direction (−z direction) may have an alignment notch AH, and the alignment notch AH may overlap at least a portion of the driving circuit DC in the thickness direction (z-axis direction). Accordingly, a lower portion of the driving circuit DC overlapping the alignment notch AH may be exposed from the cover panel 50.

A dam portion DAM for controlling the flow of a monomer may be arranged outside the power wire VSSL. The dam portion DAM may include one or more organic material layers. For example, the dam portion DAM may include a first organic material layer 207', a second organic material layer 208', and a third organic material layer 209'. According to some embodiments, the first organic material layer 207' may include the same material as the first planarization layer 207, the second organic material layer 208' may include the same material as the second planarization layer 208, and the third organic material layer 209' may include the same material as the pixel define layer 209. In some embodiments, one or more of the first organic material layer 207', the second organic material layer 208', and the third organic material layer 209' may be omitted, or one or more other organic material layers may be added.

According to some embodiments, the alignment mark AM may be located outside the dam portion DAM. Although FIG. 10 illustrates that the alignment mark AM is located on the first gate insulating layer 203, the disclosure is not limited thereto. For example, the alignment mark AM may be formed through the same patterning process as any one of metal layers forming the pixel circuit PC and the driving circuit DC. Alternatively, the alignment mark AM, according to some embodiments, may be formed through the same patterning process as an input electrode layer of an input detection layer.

According to some embodiments, the alignment mark AM may be a single layer or a multilayer, and located on different layers.

An outer dam ODAM and an outer hole OH may be located outside the dam portion DAM. The outer dam ODAM may include at least one organic material layer. The outer hole OH may be arranged to overlap the outer dam ODAM. The outer hole OH may be formed by removing a portion of an inorganic material layer on the substrate 100. The outer hole OH and the outer dam ODAM may prevent or reduce propagation of cracks from the edge of the substrate 100.

The display apparatus according to one or more embodiments may include the normal stages NSTG (see FIG. 9) and the dummy stages DSTG (see FIG. 9) arranged between the normal stages NSTG, to improve the uniformity of a pattern density of the driving portion. At this time, by arranging the dummy stages DSTG in the driving circuit DC that overlaps the alignment notch AH of the cover panel 50 of the display apparatus, a high-quality image with no horizontal stain may be displayed.

According to one or more embodiments described as above, a display panel capable of displaying relatively high-quality images and a display apparatus including the same may be implemented. The scope of embodiments according to the present disclosure is not limited by the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel, comprising:
    a substrate comprising a display area and a corner area, the corner area located outside the display area and having curved sides or polygonal sides;
    a plurality of pixels in the display area in a first direction and a second direction intersecting the first direction;
    a driving portion in the corner area and comprising a plurality of normal stages and a plurality of dummy stages between the plurality of normal stages, the plurality of normal stages being configured to output electrical signals to the plurality of pixels; and
    an alignment mark in the corner area, and disposed between an edge of the substrate and the driving portion,
    wherein the corner area includes a notch area that is defined based on the alignment mark, and some of the plurality of dummy stages are in the notch area,
    wherein the alignment mark is spaced apart from the driving portion.

2. The display panel of claim 1, wherein the plurality of normal stages and the plurality of dummy stages are arranged along a virtual line corresponding to the curved sides or polygonal sides, and
    a number of dummy stages arranged for each unit length is determined based on an angle between the virtual line and the first direction.

3. The display panel of claim 1, wherein each of the plurality of normal stages and the plurality of dummy stages comprises an input terminal, an output terminal, a first power terminal, and a second power terminal,
    the first power terminal of each of the plurality of normal stages and the plurality of dummy stages is configured to receive a first gate voltage, and
    the second power terminal of each of the plurality of normal stages and the plurality of dummy stages is configured to receive a second gate voltage.

4. The display panel of claim 3, wherein the input terminal of each of the plurality of normal stages is configured to receive an external start signal or a carry signal output by a neighboring preceding normal stage, and
    the input terminal of each of the plurality of dummy stages is configured to receive the first gate voltage.

5. The display panel of claim 3, wherein the output terminal of each of the plurality of dummy stages is floating.

6. The display panel of claim 1, wherein the alignment mark comprises a first alignment mark and a second alignment mark, the first alignment mark and the second alignment mark being symmetrical with respect to a first virtual center line passing through a center of the display area and extending in the second direction, and
    the notch area comprises a first notch area defined with respect to the first alignment mark and a second notch area defined with respect to the second alignment mark.

7. The display panel of claim 6, wherein the alignment mark further comprises a third alignment mark and a fourth alignment mark, the third alignment mark and the fourth alignment mark being symmetrical with respect to a second virtual center line passing through the first and second alignment marks and the center of the display area, and extending in the first direction, and
    the notch area comprises a third notch area defined with respect to the third alignment mark and a fourth notch area defined with respect to the fourth alignment mark.

8. The display panel of claim 1, wherein the plurality of normal stages do not overlap the notch area.

9. The display panel of claim 1, wherein the driving portion comprises a first driving portion and a second driving portion spaced apart from the first driving portion,
    a structure of a normal stage in the first driving portion is identical to a structure of a dummy stage in the first driving portion, and
    a structure of a normal stage in the second driving portion is identical to a structure of a dummy stage in the second driving portion.

10. The display panel of claim 9, wherein the first driving portion comprises an emission control circuit and a first scan driving circuit, and the second driving portion comprises a second scan driving circuit.

11. A display apparatus comprising:

a display panel;

a cover panel on a rear surface of the display panel and including an alignment notch, wherein the display panel comprises:

a substrate comprising a display area and a corner area, the corner area being outside the display area and having curved sides or polygonal sides;

a plurality of pixels in the display area in a first direction and a second direction intersecting the first direction;

a driving portion in the corner area and comprising a plurality of normal stages and a plurality of dummy stages between the plurality of normal stages, the plurality of normal stages being configured to output electrical signals to the plurality of pixels; and an alignment mark in the corner area, and disposed between an edge of the substrate and the driving portion, wherein the alignment notch of the cover panel overlaps some of the plurality of dummy stages of the display panel in a thickness direction thereof, wherein the alignment mark is spaced apart from the driving portion.

12. The display apparatus of claim 11, wherein the plurality of normal stages and the plurality of dummy stages are arranged along a virtual line corresponding to the curved sides or the polygonal sides, and a number of dummy stages arranged for each unit length is determined based on an angle between the virtual line and the first direction.

13. The display apparatus of claim 11, wherein each of the plurality of normal stages and the plurality of dummy stages comprises an input terminal, an output terminal, a first power terminal, and a second power terminal, a first gate voltage is applied to the first power terminal of each of the plurality of normal stages and the plurality of dummy stages, and a second gate voltage is applied to the second power terminal of each of the plurality of normal stages and the plurality of dummy stages.

14. The display apparatus of claim 13, wherein an external start signal or an output signal of a neighboring preceding normal stage is applied to the input terminal of each of the plurality of normal stages, and the first gate voltage is applied to the input terminal of each of the plurality of dummy stages.

15. The display apparatus of claim 13, wherein the output terminal of each of the plurality of dummy stages is floating.

16. The display apparatus of claim 11, wherein the driving portion comprises a first driving portion and a second driving portion spaced apart from the first driving portion, a structure of a normal stage in the first driving portion is identical to a structure of a dummy stage in the first driving portion, and a structure of a normal stage in the second driving portion is identical to a structure of a dummy stage in the second driving portion.

17. The display apparatus of claim 16, wherein the first driving portion comprises an emission control circuit and a first scan driving circuit, and the second driving portion comprises a second scan driving circuit.

18. The display apparatus of claim 11, wherein the alignment mark comprises a first alignment mark and a second alignment mark, the first alignment mark and the second alignment mark being symmetrical with respect to a first virtual center line passing through a center of the display area and extending in the second direction, and the alignment notch comprises a first alignment notch corresponding to the first alignment mark and a second alignment notch corresponding to the second alignment mark.

19. The display apparatus of claim 18, wherein the alignment mark further comprises a third alignment mark and a fourth alignment mark, the third alignment mark and the fourth alignment mark being symmetrical with respect to a second virtual center line passing through the first and second alignment marks and the center of the display area, and extending in the first direction, and the alignment notch comprises a third alignment notch corresponding to the third alignment mark and a fourth alignment notch corresponding to the fourth alignment mark.

20. The display apparatus of claim 11, wherein the plurality of normal stages do not overlap the alignment notch.

21. The display apparatus of claim 11, wherein an area of the cover panel is smaller than an area of the display panel, and at least a portion of an edge of the cover panel is outside the driving portion.

* * * * *